United States Patent
Kurtin et al.

(10) Patent No.: US 9,269,844 B2
(45) Date of Patent: Feb. 23, 2016

(54) CERAMIC COMPOSITION HAVING DISPERSION OF NANO-PARTICLES THEREIN AND METHODS OF FABRICATING SAME

(71) Applicants: Juanita N. Kurtin, Hillsboro, OR (US); Georgeta Masson, Lafayette, CA (US)

(72) Inventors: Juanita N. Kurtin, Hillsboro, OR (US); Georgeta Masson, Lafayette, CA (US)

(73) Assignee: Pacific Light Technologies Corp., Portland, OR (US)

(*) Notice: Subject to any disclaimer, the term of this patent is extended or adjusted under 35 U.S.C. 154(b) by 10 days.

(21) Appl. No.: 14/095,825

(22) Filed: Dec. 3, 2013

(65) Prior Publication Data

US 2014/0166945 A1 Jun. 19, 2014

Related U.S. Application Data

(62) Division of application No. 13/713,657, filed on Dec. 13, 2012.

(51) Int. Cl.

| | |
|---|---|
| *H01L 31/0264* | (2006.01) |
| *H01L 33/50* | (2010.01) |
| *C09K 11/02* | (2006.01) |
| *C09K 11/88* | (2006.01) |
| *H01L 31/055* | (2014.01) |
| *B82Y 20/00* | (2011.01) |
| *B82Y 40/00* | (2011.01) |
| *B82Y 30/00* | (2011.01) |

(52) U.S. Cl.
CPC ............ *H01L 31/0264* (2013.01); *C09K 11/02* (2013.01); *C09K 11/883* (2013.01); *H01L 31/055* (2013.01); *H01L 33/50* (2013.01); *H01L 33/502* (2013.01); *B82Y 20/00* (2013.01); *B82Y 30/00* (2013.01); *B82Y 40/00* (2013.01); *H01L 33/504* (2013.01); *H01L 33/507* (2013.01); *Y10S 977/774* (2013.01); *Y10S 977/779* (2013.01)

(58) Field of Classification Search
None
See application file for complete search history.

(56) References Cited

U.S. PATENT DOCUMENTS 5,200,237 A 4/1993 Sugama
5,371,262 A * 12/1994 Arkles .......................... 556/449
(Continued)

FOREIGN PATENT DOCUMENTS

WO WO-2012043567 4/2012

OTHER PUBLICATIONS

Zheng et al. "From Glutathione Capping to a Crosslinked, Phytochelatin-Like Coating of Quantum Dots" Advanced Materials, 2008, 20, 3410-34-15.*

(Continued)

*Primary Examiner* — Robert S Loewe
(74) *Attorney, Agent, or Firm* — Blakely, Sokoloff, Taylor & Zafman

(57) ABSTRACT

Ceramic compositions having a dispersion of nano-particles therein and methods of fabricating ceramic compositions having a dispersion of nano-particles therein are described. In an example, a method of forming a composition having a dispersion of nano-particles therein includes forming a mixture of semiconductor nano-particles and ceramic precursor molecules. A ceramic matrix is formed from the ceramic precursor molecules. The ceramic matrix includes a dispersion of the semiconductor nano-particles therein. In another example, a composition includes a medium including ceramic precursor molecules. The medium is a liquid or gel at 25 degrees Celsius. A plurality of semiconductor nano-particles is suspended in the medium.

19 Claims, 12 Drawing Sheets

(56) References Cited

U.S. PATENT DOCUMENTS

| | | | |
|---|---|---|---|
| 5,853,808 A * | 12/1998 | Arkles et al. | 427/377 |
| 6,710,366 B1 * | 3/2004 | Lee et al. | 257/14 |
| 6,770,726 B1 * | 8/2004 | Arkles et al. | 528/42 |
| 6,881,490 B2 * | 4/2005 | Kambe et al. | 428/447 |
| 7,042,020 B2 * | 5/2006 | Negley | 257/98 |
| 7,385,003 B1 * | 6/2008 | Thoma et al. | 524/858 |
| 7,402,832 B2 | 7/2008 | Lee | |
| 7,560,859 B2 * | 7/2009 | Saito et al. | 313/498 |
| 7,598,314 B2 * | 10/2009 | Lee et al. | 524/588 |
| 7,736,837 B2 * | 6/2010 | Abdallah et al. | 430/272.1 |
| 8,237,154 B2 | 8/2012 | Jang et al. | |
| 8,389,663 B2 * | 3/2013 | Brock et al. | 528/41 |
| 2002/0119304 A1 | 8/2002 | Arney et al. | |
| 2003/0214699 A1 * | 11/2003 | Banin et al. | 359/333 |
| 2003/0236347 A1 | 12/2003 | Furuya et al. | |
| 2004/0095658 A1 | 5/2004 | Buretea et al. | |
| 2004/0266148 A1 | 12/2004 | Yim et al. | |
| 2005/0017260 A1 | 1/2005 | Lee | |
| 2005/0038220 A1 | 2/2005 | Shin et al. | |
| 2005/0107478 A1 | 5/2005 | Kilmov et al. | |
| 2006/0029802 A1 | 2/2006 | Ying et al. | |
| 2006/0054863 A1 | 3/2006 | Dai et al. | |
| 2006/0060862 A1 | 3/2006 | Bawendi et al. | |
| 2006/0068154 A1 | 3/2006 | Parce et al. | |
| 2006/0081862 A1 * | 4/2006 | Chua et al. | 257/98 |
| 2006/0113895 A1 * | 6/2006 | Baroky et al. | 313/501 |
| 2006/0157686 A1 | 7/2006 | Jang et al. | |
| 2007/0087197 A1 | 4/2007 | Jang et al. | |
| 2007/0122101 A1 * | 5/2007 | Buretea et al. | 385/141 |
| 2007/0182060 A1 | 8/2007 | Cavallini et al. | |
| 2008/0017242 A1 | 1/2008 | Sinha et al. | |
| 2008/0085365 A1 | 4/2008 | Yamada et al. | |
| 2008/0095852 A1 * | 4/2008 | Kong et al. | 424/489 |
| 2008/0108122 A1 | 5/2008 | Paul et al. | |
| 2008/0118755 A1 | 5/2008 | Whiteford et al. | |
| 2008/0237540 A1 * | 10/2008 | Dubrow | 252/301.6 S |
| 2009/0074374 A1 | 3/2009 | Fujiue et al. | |
| 2009/0324476 A1 * | 12/2009 | Watkins et al. | 423/326 |
| 2010/0009001 A1 * | 1/2010 | Armes et al. | 424/490 |
| 2010/0086872 A1 | 4/2010 | Ogihara et al. | |
| 2010/0129300 A1 * | 5/2010 | Nayfeh et al. | 424/59 |
| 2010/0243221 A1 | 9/2010 | Yamasaki et al. | |
| 2010/0276310 A1 | 11/2010 | Chen et al. | |
| 2010/0276638 A1 * | 11/2010 | Liu et al. | 252/301.35 |
| 2011/0034659 A1 * | 2/2011 | Kashio et al. | 528/33 |
| 2011/0068321 A1 | 3/2011 | Pickett et al. | |
| 2011/0068322 A1 | 3/2011 | Pickett et al. | |
| 2011/0084250 A1 | 4/2011 | Jang et al. | |
| 2011/0177339 A1 * | 7/2011 | Lu et al. | 428/403 |
| 2011/0241229 A1 * | 10/2011 | Naasani et al. | 257/793 |
| 2011/0269297 A1 | 11/2011 | Novichkov et al. | |
| 2011/0278616 A1 | 11/2011 | Washizu et al. | |
| 2011/0306079 A1 | 12/2011 | Tulsky et al. | |
| 2013/0026506 A1 | 1/2013 | Arbell | |
| 2013/0112941 A1 | 5/2013 | Kurtin et al. | |
| 2013/0112942 A1 * | 5/2013 | Kurtin et al. | 257/13 |
| 2013/0115455 A1 * | 5/2013 | Banin et al. | 428/375 |
| 2013/0241397 A1 | 9/2013 | Hong et al. | |

OTHER PUBLICATIONS

Takada et al. "Control of Particle Size Distribution of CdS Quantum Dots in Gel Matrix" Journal of Sol-Gel Science and Technology, 1:123-132, 1994.*

Sharma et al. "Luminescence studies and formation mechanism of symmetrically dispersed ZnO quantum dots embedded in $SiO_2$ matrix" Journal of Luminescence, 129, 2009, 605-610.*

Mensinger, et al., "Synthesis of Heterometallic Group 13 Nanoclusters and Inks for Oxide Thin-Film Transistors," Angew. Chem. Int. Ed. 2008, vol. 47, pp. 9484-9486.

Non-Final Office Action for U.S. Appl. No. 13/713,657, Mailed Mar. 6, 2014, 13 pages.

Non-Final Office Action for U.S. Appl. No. 14/055,727, Mailed Jul. 7, 2014, 12 pages.

Final Office Action for U.S. Appl. No. 13/713,657, Mailed Jul. 28, 2014, 12 pages.

Arkles, Barry Dr., et al., High Density Silicon Dioxide Coatings by UV and Thermal Processing, Silicones in Coatings III, Silicones in Coatings III, Barcelona, Spain, Mar. 28-30, 2000.

International Search Report and Written Opinion from PCT/US2013/074201 mailed Sep. 26, 2014, 12 pgs.

Office Action for U.S. Appl. No. 13/713,657, (Mar. 9, 2015), Whole Document.

International Preliminary Report on Patentability from PCT/US2013/074201 mailed Jun. 25, 2015, 9 pgs.

Final Office Action for U.S. Appl. No. 13/713,657, mailed Aug. 26, 2015.

Final Office Action for U.S. Appl. No. 14/055,727, (Apr. 1, 2015), Whole Document.

Non-Final Office Action for U.S. Appl. No. 14/055,727, mailed Jul. 20, 2015.

* cited by examiner

WHITE LIGHT

US 9,269,844 B2

CERAMIC COMPOSITION HAVING DISPERSION OF NANO-PARTICLES THEREIN AND METHODS OF FABRICATING SAME

CROSS-REFERENCE TO RELATED APPLICATIONS

This application is a Divisional of and claims the benefit of U.S. patent application Ser. No. 13/713,657 filed Dec. 13, 2012, the entire contents of which are hereby incorporated by reference herein.

TECHNICAL FIELD

Embodiments of the present invention are in the field of quantum dots and, in particular, ceramic compositions having a dispersion of nano-particles therein and methods of fabricating ceramic compositions having a dispersion of nano-particles therein.

BACKGROUND

Quantum dots having a high photoluminescence quantum yield (PLQY) may be applicable as down-converting materials in down-converting nano-composites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

Embodiments of the present invention include ceramic compositions having a dispersion of nano-particles therein and methods of fabricating ceramic compositions having a dispersion of nano-particles therein.

In an embodiment, a method of forming a composition having a dispersion of nano-particles therein includes forming a mixture of semiconductor nano-particles and ceramic precursor molecules. A ceramic matrix is formed from the ceramic precursor molecules. The ceramic matrix includes a dispersion of the semiconductor nano-particles therein.

In another embodiment, a method of applying a light-conversion layer to a surface of a light-emitting diode (LED) includes forming a ceramic matrix from a mixture of quantum dots and ceramic precursor molecules. The ceramic matrix includes a dispersion of the quantum dots therein. The ceramic matrix is applied to the surface of the LED.

In another embodiment, a method of applying a light-conversion layer to a surface of a light-emitting diode (LED) includes applying a mixture of quantum dots and ceramic precursor molecules to the surface of the LED. A ceramic matrix is formed from the mixture, on the surface of the LED. The ceramic matrix includes a dispersion of the quantum dots therein.

In another embodiment, a composition includes a medium including ceramic precursor molecules. The medium is a liquid or gel at 25 degrees Celsius. A plurality of semiconductor nano-particles is suspended in the medium.

DETAILED DESCRIPTION

Figure 1:
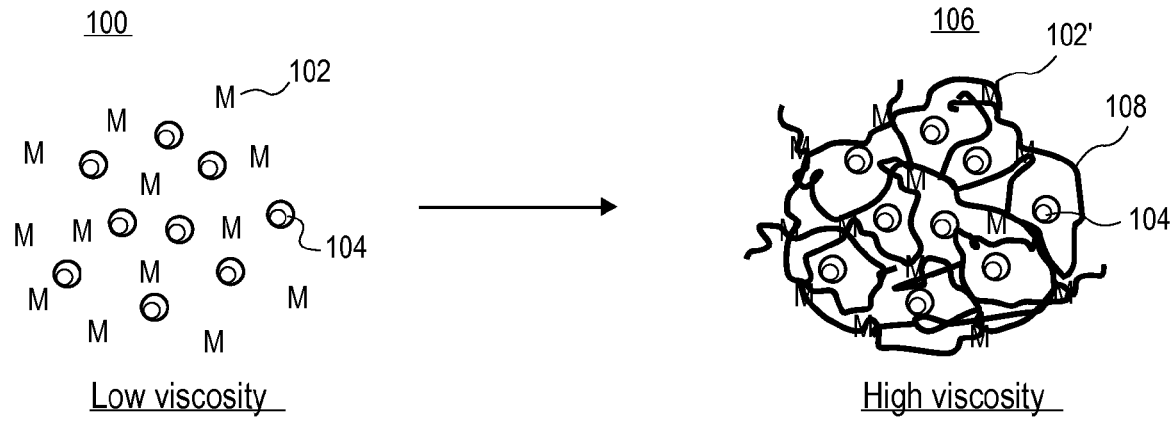
FIG. 1 is a schematic of the conversion of a composition to a matrix including a dispersion of semiconductor structures, such as quantum dots, therein, in accordance with an embodiment of the present invention.

Ceramic compositions having a dispersion of nano-particles therein and methods of fabricating ceramic compositions having a dispersion of nano-particles therein are described herein. It the following description, numerous specific details are set forth, such as specific quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs), are not described in detail in order to not unnecessarily obscure embodiments of the present invention. Furthermore, it is to be understood that the various embodiments shown in the figures are illustrative representations and are not necessarily drawn to scale.

One or more embodiments described herein are directed to improvements for quantum dot (QD) performance by fabrication of thin films with high loadings of QDs therein for solid state lighting, such as light emitting diodes (LEDs). Other applications of such films can include uses in other LED applications, photovoltaics, sensing, photonics, and biotechnology.

To provide context, while integrating QDs into a silicone matrix has been pursued as a competitive drop-in replacement for phosphors, some limitations of silicones can be a barrier to such applications. Limitations such as difficulty in high loading of inorganic nanostructures per unit mass polymer, lack of homogeneous dispersibility, and inhibiting thermo-mechanical properties of the silicones are examples significant hurdles to replacing phosphor based materials with QD based materials. In particular, a significant challenge has been to achieve a necessary high loading of QDs a thin layer (e.g., a layer having a thickness of approximately ca. 100 microns), which can be deposited directly onto an LED device.

To address the above issues, one or more embodiments described herein involve integrating nano-particles (such as quantum dots) into an infinite network such as cross-linked polymers or ceramics from small molecular or oligomeric (low molecular polymers) dispersions with low viscosity. The low viscosity species are precursors for polymeric or other types of inorganic matrices. This general approach enables much higher loading of the QDs in the resulting QD containing application layer or film. Furthermore, particle separation that can otherwise result in localized agglomeration of particles is avoided. In one such embodiment, the use of a thin film prepared from a sol-gel material incorporating QDs represents a departure from a silicone based polymer matrix and can be used together with an approach involving encapsulation of individual QDs with an insulator. The resulting system can ultimately exhibit increasing, rather than decreasing, photoluminescence (PO as correlated with increasing temperature.

As elaborated below, some embodiments involve the use of quantum dot hetero-structures (QDHs) dispersed in cyclic monomers (e.g., cyclosiloxanes) with an intrinsic ability to open and polymerize in the presence of an adequate initiator. Other embodiments, involve the use of organo-ester alkoxide silsesquioxanes as relatively small molecular precursors to silica. Both types of examples can have the advantage of high metal content and low volatility. Additionally, polysilsesquioxanes can have the advantage of chemical versatility where a reactive organic moiety may participate in a copolymerization reaction. Such an approach provides control over mechanical properties through copolymerization. Also, silanol or other reactive groups may be included to participate in chemical reaction and the synthesis of cross-linked matrices. One prepared, or during preparation, the polymer matrices can be used for coating an LED chip.

The illustrate the above general concepts, FIG. 1 is a schematic of the conversion of a composition 100 to a matrix 106 including a dispersion of semiconductor structures 104, such as quantum dots, therein, in accordance with an embodiment of the present invention. Referring to FIG. 1, the composition 100 includes a plurality of discrete prepolymer molecules or ceramic precursor molecules 102 (designated as "M") along with a plurality of the semiconductor structures 104. Upon modification of the composition 100, the resulting matrix 106 is a polymer matrix or a ceramic matrix, respectively. The modification may be performed by, e.g., use of an initiator, a catalyst, appropriate reaction conditions such as heating, or combinations thereof. The matrix 106 can include a polymeric or long range molecular network 108 and can, possibly, included modified portions 102' of the prepolymer molecules or ceramic precursor molecules 102, as depicted in FIG. 1. In a specific embodiment, the composition 100 has a low viscosity while the matrix 106 has a relatively high viscosity, generating a controlled dispersion of the semiconductor structures 104. As described in greater detail below, examples of reaction pathways include, but are not limited to, sol-gel (silanol condensation) pathways, polymerization (e.g., acrylic, epoxy) or side group (beta) elimination (thermal or photo-curing). Other examples include, but are not limited to, the use of metal-oxide precursors other than silicon oxide such as aluminosilicate (zeolites) or diethoxysiloxane-ethyltitanate as a titania-silicate aerogel or metal-chalcogenides such as zinc sulfide (ZnS).

Using the above general approach, in an embodiment, very thin, dense layers of QDs can be formed on an LED chip. Additionally, the generation of a stable dispersion and ready-to-apply formulation with long shelf-life can be achieved. Furthermore, a procedure for generating a protective matrix and enhance performance of QDs incorporated therein under operating condition can be realized, while aggregation of harmful compounds from reaching the QD surfaces can be prevented. In a particular example, nano-particles are dispersed in a small-molecular medium which has the ability to load a higher amount of particulates per mass unit of resulting polymer and, then a homogeneous nano-composite is generated. The dispersion can be further applied on the LED chip in a thin layer followed by curing which can immobilize the nano-composites on the surface yet permit flowing of the polymer at higher temperatures.

More specifically, nano-particles (with or without a silica shelling) are dispersed in a concentrated solution of a monomer (e.g., small molecules able to react with each other to generate polymers). The monomers can be selected from a class of cyclosiloxanes as, described below. An optionally included solvent can be selected for suitability as a dispersant for both monomer and polymer and to not induce precipitation or aggregation of nano-particles. An amount of initiator can be added suitable to dictate the final molecular weight of the polymer. The reaction can be permitted for a controlled amount of time (e.g., 1 hour) and terminated with a small molecule that reacts with the active centers (e.g., an alcohol). Alternatively, nano-particles can be dispersed in small molecular or oligomeric compounds containing reactive organo-metallic sites. The organic moieties are eliminated under certain conditions (e.g., temperature, moisture, UV-light) to yield a cured inorganic matrix (metal-oxides). To the above dispersions, a cross-linker or catalyst, or both, can be added using 1 or 2-part formulation. Components can depend on the type of curing to be used. For example, if a vinyl cyclosiloxane is used as a monomer, the formulation can include a multifunctional hydrosilane and a Pt based catalyst. The formulations may be designed depending on curing protocols which can be triggered by moisture or other condensation processes, UV-light or temperature. Ideally, the dispersion is used without further purification for chip coating using deposition methods such as spraying, dip-coating, spin-coating or drop-casting.

In a first general aspect, compositions having a dispersion of nano-particles therein and methods of fabricating compositions having a dispersion of nano-particles therein from small molecule prepolymers are described. Overall, in a general embodiment as illustrated in FIG. 1, a mixture 100 of semiconductor nano-particles 104 and discrete prepolymer molecules 102 is formed. A polymer matrix 106 is then formed from the discrete prepolymer molecules 102. The polymer matrix 106 includes a dispersion of the semiconductor nano-particles 104 therein. In one such embodiment, the discrete prepolymer molecules are cyclic monomers, and forming the polymer matrix involves opening the cyclic monomers with an initiator species by adding the initiator species to the mixture. In another embodiment, the mixture and the polymer matrix are formed at temperatures approximately in the range of 20-30 degrees Celsius. In yet another embodiment, the polymer matrix is formed from the discrete prepolymer molecules by using an approach such as, but not limited to, a silanol condensation sol-gel reaction, an acrylic or epoxy based polymerization reaction, a thermal β-elimination reaction, or a photo-β-elimination reaction.

Figure 2:
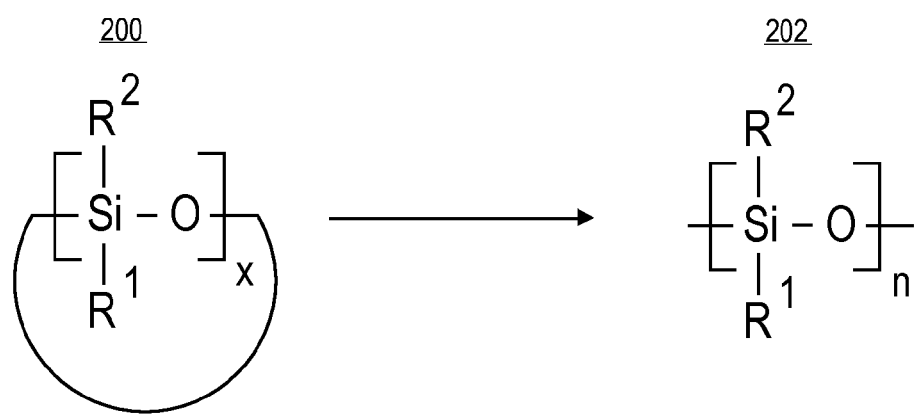
FIG. 2 illustrates a reaction pathway where a polysiloxane matrix is formed by ring-opening of cyclic monomers, such as cyclosiloxanes, in accordance with an embodiment of the present invention.

FIG. 2 illustrates a reaction pathway where a polysiloxane matrix 202 is formed by ring-opening of cyclic monomers 200, such as cyclosiloxanes, in accordance with an embodiment of the present invention. In one such embodiment, opening the cyclic monomers 200 with the initiator species involves using a chain growth mechanism. In that case, a chain growth termination species can be added to the mixture a duration of time subsequent to adding the initiator species to the mixture. In another such embodiment, additional cyclic monomers are added to the mixture subsequent to adding the initiator species to the mixture.

As depicted in FIG. 2, the cyclic monomers 200 can be cyclic siloxane monomers of the formula —[Si(R)(R')—O]$_n$—, where, in an embodiment, n is 3, 4, 5 or 6, and where R or R' is a ligand such as, but not limited to, H, Cl, an alkyl radical with 1-8 carbon atoms, a fluoroalkyl of 3-8 carbon atoms, allyl, vinyl, or combinations thereof. In an embodiment, the added initiator species is an electrophile such as, but not limited to, an alkali metal hydroxide, an alkoxide, or a tetraalkylammonium silanolate. In a specific embodiment, subsequent to adding the initiator species to the mixture, the mixture is quenched with water, an alcohol, or a functional disiloxane. As an example, the mixture can be quenched is approximately 1-6 hours after adding the initiator species to the mixture.

A mixture of semiconductor structures and discrete prepolymer molecules, such as cyclic monomers 200, can further include a solvent. In one such embodiment, a suspension of the semiconductor nano-particles and discrete prepolymer molecules is formed in a solvent such as, but not limited to, toluene, ethyl benzene, tetrahydrofuran, hexane, or cyclohexane. However, in another embodiment, the mixture of semiconductor nano-particles discrete (prepolymer molecules is formed in the absence of a solvent. In an embodiment, the mixture and, hence, the resulting polymer matrix, are formed in an acid-free environment. In yet another embodiment, the mixture and, hence, the resulting polymer matrix, are formed under anhydrous conditions.

In a second general aspect, ceramic compositions having a dispersion of nano-particles therein and methods of fabricating ceramic compositions having a dispersion of nano-particles therein from ceramic precursor molecules are described. Overall, in a general embodiment, as is also illustrated in FIG. 1, a mixture 100 of semiconductor nano-particles 104 and ceramic precursor molecules 102 is formed. A ceramic matrix 106 is then formed from the ceramic precursor molecules 102. The ceramic matrix 106 includes a dispersion of the semiconductor nano-particles 104 therein.

Figure 3A:
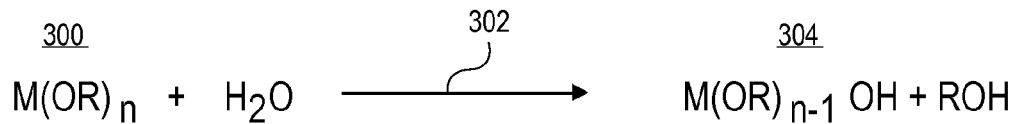
FIG. 3A is a schematic of a hydration reaction of metal alkoxide molecules to provide an active species, in accordance with an embodiment of the present invention.
Figure 3B:
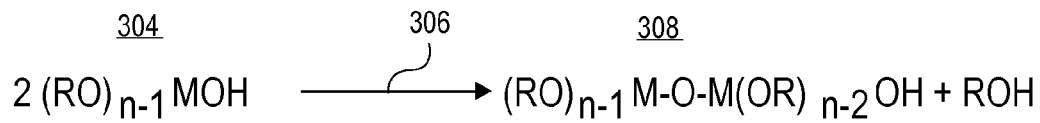
FIG. 3B is a schematic of a condensation reaction of the active species of FIG. 3A to provide a condensed active species, in accordance with an embodiment of the present invention.
Figure 3C:
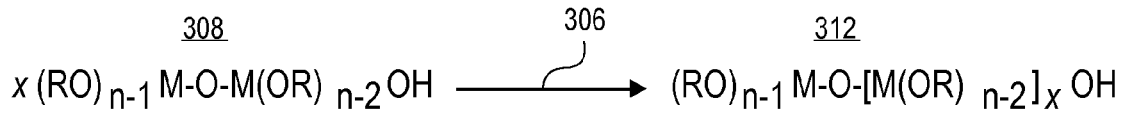
FIG. 3C is a schematic of a sol formation reaction of the condensed active species of FIG. 3B to provide a polycondensed sot active species, in accordance with an embodiment of the present invention.
Figure 3D:
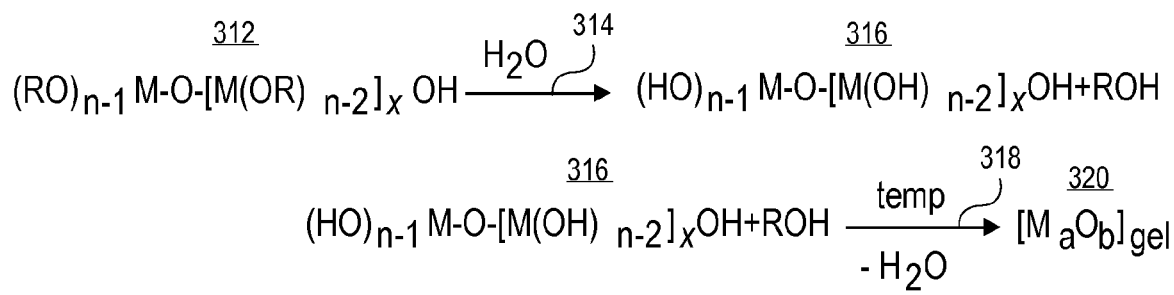
FIG. 3D is a schematic of cross-linking reactions of the polycondensed sol active species of FIG. 3C to provide a gel, in accordance with an embodiment of the present invention.

In an exemplary embodiment, the ceramic precursor molecules 102 are discrete molecules. The resulting ceramic matrix 106 is an infinite inorganic network. FIGS. 3A-3D are schematics of reactions involving the formation of a ceramic matrix of an infinite inorganic network as formed from discrete ceramic precursor molecules, in accordance with an embodiment of the present invention. Specifically, referring to FIG. 3A, the discrete molecules 102 are metal alkoxide molecules 300. The metal alkoxide molecules 300 undergo hydration 302 to provide active species 304 formation. The active species 304 undergo a condensation reaction 306 to provide a condensed active species 308, as depicted in FIG. 3B. Then, referring to FIG. 3C, the condensed active species 308 undergo sol formation 310 to provide polycondensed sot active species 312. The polycondensed sol active species 312 are cross-linked through hydrolysis 314, and the resulting species 316 is heated 318 to form a gel 320, as depicted in FIG. 3D. The gel 320 is an infinite inorganic network (such as 106) thus formed from hydrolysis of metal alkoxide molecules via hydrolyzed intermediate species.

Referring again to FIGS. 3A-3D, overall, metal-oxides synthesis by sol-gel process may be broken out in several stages or, alternatively, the reactions can proceed essentially simultaneously following the reaction of FIG. 3A. Nonetheless, the final product is an infinite inorganic (e.g., ceramic) polymer network. It is to be understood that one of the RO groups can be replace by H or an organic group (e.g., methyl, vinyl) for ceramic structure and functionality variation. Also, the starting materials can include a hybrid or mixture of silane with other metal-alkoxides (e.g., sec-butixyaluminooxytri-ethoxysilane or di-isopropoxy-di-(trimethylsiloxy)titanate).

Figure 4:
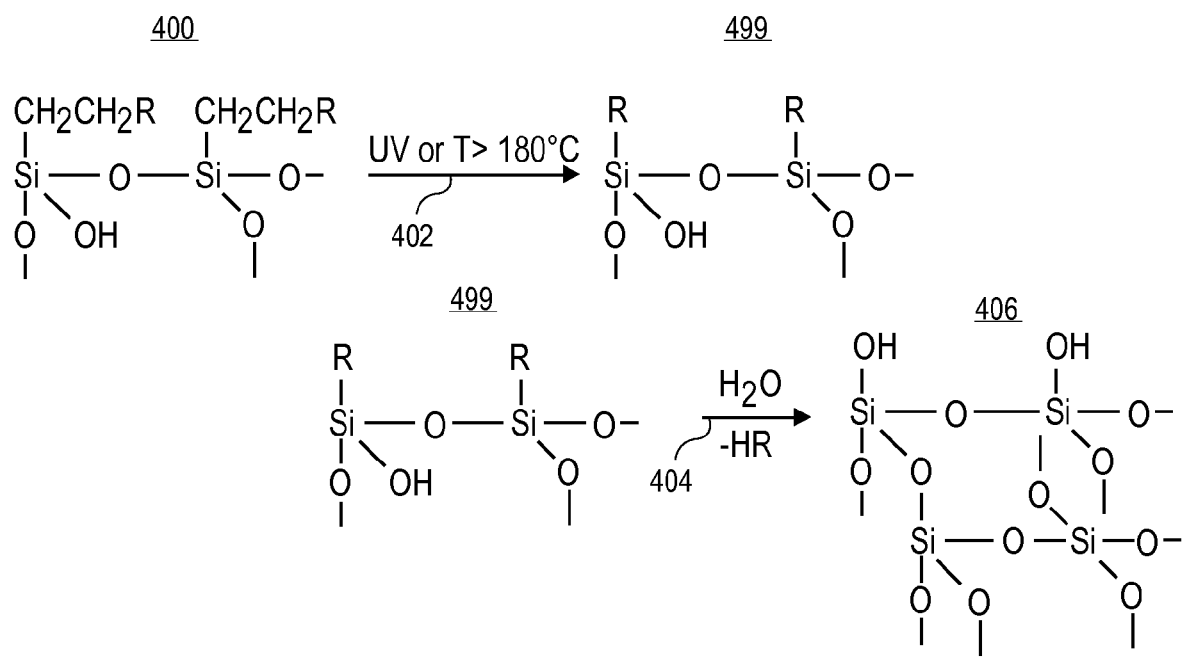
FIG. 4 is a schematic of reactions involving the formation of a ceramic matrix of an infinite inorganic network as formed from linear ceramic: precursor molecules, in accordance with an embodiment of the present invention.

In another embodiment, a ceramic matrix 106 is formed from linear metal oxide polymers or metal-oxide copolymers, they are formed essentially from a process using only the reaction described in association with FIG. 3D, where the actual ceramic matrix synthesis begins with a linear species. Examples of such precursors include, but are not limited to, polyalkoxysiloxanes (e.g., with methyl or ethyl ligands), diethoxysiloxane, diethoxysiloxane-s-butylaluminate copolymer, poly(dibutyl titanate), or diethoxysiloxane-ethyltitanate copolymer. FIG. 4 is a schematic of reactions involving the formation of a ceramic matrix of an infinite inorganic network as formed from linear ceramic precursor molecules, in accordance with an embodiment of the present invention. Referring to FIG. 4, infinite metal-oxide 406 synthesis from linear precursors 400 is performed by a sol-gel process involving a light (e.g., ultra-violet (UV)) or thermal (e.g., T>180 degrees Celsius) initiation process 402 and subsequent hydration process 404 through intermediate species 499.

Referring again to FIGS. 3A-3D and 4, in an embodiment, the ceramic precursor molecules are metal ceramic precursor molecules, and forming the ceramic matrix involves catalyzing the metal ceramic precursor molecules to form a metal oxide matrix. In one such embodiment, a metal silicate matrix such as, but not limited to, an aluminosilicate matrix or a titaniasilicate matrix is formed. In one embodiment, the metal ceramic precursor molecules are catalyzed to form the metal oxide matrix by adding a strong base to the starting mixture. In another embodiment, the metal ceramic precursor molecules are catalyzed to form the metal oxide matrix by heating the mixture. In yet another embodiment, the metal ceramic precursor molecules are catalyzed to form the metal oxide matrix by exposing the mixture to ultra-violet (UV) light. It is to be understood that, in alternative embodiments, the ceramic precursor molecules are non-metal ceramic precursor molecules, and forming the ceramic matrix involves catalyzing the non-metal ceramic precursor molecules to form a silica matrix.

In either case (metal or non-metal), in a specific embodiment, a ceramic matrix is formed by using precursors having thermal and/or UV labile polysilsequioxane with β-electron withdrawing groups, e.g., acetoxy, chloro, or bromo. Such an approach yields silica-rich structures. Exposure to UV light or temperatures of 180° C. and up can be used to perform the reactions with suitable reaction rates. However, a lower temperature conversion can be facilitated in the presence of a fluorine salt, including catalysts such as tetrabutylammonium fluoride.

In another embodiment, the ceramic precursor molecules 102 are metal or metal-organic clusters. The use of such clusters can provide synthesis of ceramic matrices by an entirely inorganic, rapid, low-volume loss condensation pathway to provide homogeneous films of the ceramic matrices. In other embodiments, however, the ceramic precursor molecules 102 are polymeric. For example, in a specific embodiment, the polymeric ceramic precursor molecules are linear metal oxide polymers, and forming the ceramic matrix involves forming a metal oxide matrix via cross-linking mechanisms, such as described in association with FIG. 4.

A mixture of semiconductor structures and ceramic precursor molecules, such as metal alkoxides 300, can further include a solvent. In one such embodiment, a suspension of the semiconductor nano-particles and ceramic precursor molecules is formed in a solvent such as, but not limited to, toluene, ethyl benzene, tetrahydrofuran, hexane, or cyclohexane. However, in another embodiment, the mixture of semiconductor nano-particles and ceramic precursor molecules is formed in the absence of a solvent. In an embodiment, the mixture and, hence, the resulting ceramic matrix, are formed in an acid-free environment. In yet another embodiment, the mixture and, hence, the resulting ceramic matrix, are formed under aqueous conditions. In an alternative embodiment, however, the mixture and, hence, the resulting ceramic matrix, are formed under anhydrous conditions.

Figure 5:
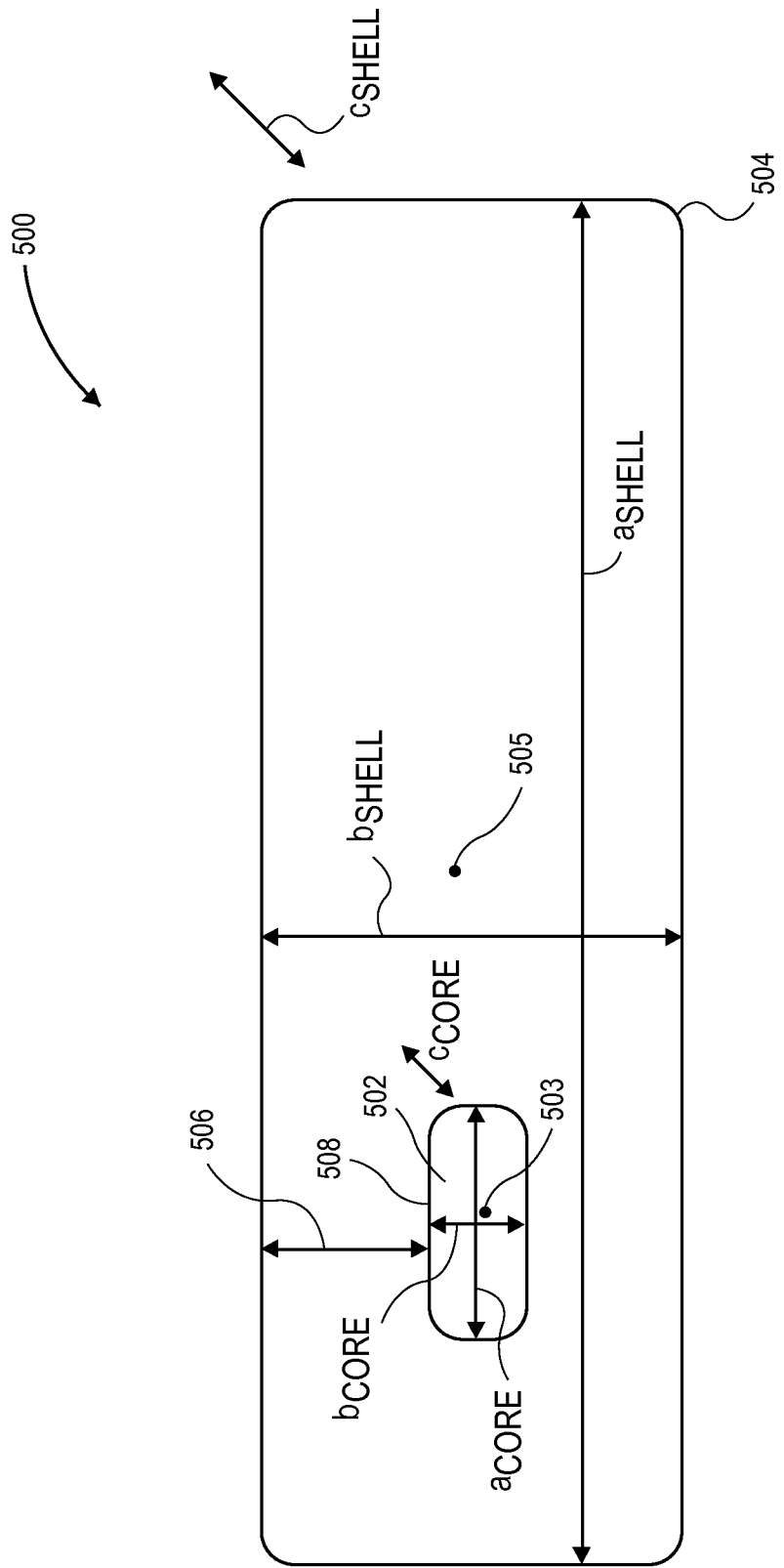
FIG. 5 illustrates a schematic of a cross-sectional view of a quantum dot suitable for dispersion in a composition or composition precursor, in accordance with an embodiment of the present invention.

In another aspect, the above described compositions, or composition precursors, having a dispersion of nano-particles therein can include hetero-structure-based nano-particles, such as hetero-structure-based quantum dots. Such hetero-structures may have specific geometries suitable for performance optimization. In an example, several factors may be intertwined for establishing an optimized geometry for a quantum dot having a nano-crystalline core and nano-crystalline shell pairing. As a reference, FIG. 5 illustrates a schematic of a cross-sectional view of a quantum dot suitable for dispersion in a composition or composition precursor, in accordance with an embodiment of the present invention. Referring to FIG. 5, a semiconductor structure (e.g., a quantum dot structure) 500 includes a nano-crystalline core 502 surrounded by a nano-crystalline shell 504. The nano-crystalline core 502 has a length axis ($a_{CORE}$), a width axis ($b_{CORE}$) and a depth axis ($c_{CORE}$), the depth axis provided into and out of the plane shown in FIG. 5. Likewise, the nano-crystalline shell 504 has a length axis ($a_{SHELL}$), a width axis ($b_{SHELL}$) and a depth axis ($c_{SHELL}$), the depth axis provided into and out of the plane shown in FIG. 5. The nano-crystalline core 502 has a center 503 and the nano-crystalline shell 504 has a center 505. The nano-crystalline shell 504 surrounds the nano-crystalline core 502 in the b-axis direction by an amount 506, as is also depicted in FIG. 5.

The following are attributes of a quantum dot that may be tuned for optimization, with reference to the parameters provided in FIG. 5, in accordance with embodiments of the present invention. Nano-crystalline core 502 diameter (a, b c) and aspect ratio (e.g., a/b) can be controlled for rough tuning for emission wavelength (a higher value for either providing increasingly red emission). A smaller overall nano-crystalline core provides a greater surface to volume ratio. The width of the nano-crystalline shell along 506 may be tuned for yield optimization and quantum confinement providing approaches to control red-shifting and mitigation of surface effects. However, strain considerations must be accounted for when optimizing the value of thickness 506. The length ($a_{SHELL}$) of the shell is tunable to provide longer radiative decay times as well as increased tight absorption. The overall aspect ratio of the structure 500 the greater of $a_{SHELL}/b_{SHELL}$ and $a_{SHELL}/c_{SHELL}$) may be tuned to directly impact PLQY. Meanwhile, overall surface/volume ratio for 500 may be kept relatively smaller to provide lower surface defects, provide higher photoluminescence, and limit self-absorption. Referring again to FIG. 5, the shell/core interface 508 may be tailored to avoid dislocations and strain sites. In one such embodiment, a high quality interface is obtained by tailoring one or more of injection temperature and mixing parameters, the use of surfactants, and control of the reactivity of precursors, as is described in greater detail below.

In accordance with an embodiment of the present invention, a high PLQY quantum dot is based on a core/shell pairing using an anisotropic core. With reference again to FIG. 5, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nano-crystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nano-crystalline core composed of a first semiconductor material and having an aspect ratio between, but not including, 1.0 and 2.0. The semiconductor structure also includes a nano-crystalline shell composed of a second, different, semiconductor material at least partially surrounding the anisotropic nano-crystalline core. In one such embodiment, the aspect ratio of the anisotropic nano-crystalline core is approximately the range of 1.01-1.2 and, in a particular embodiment, is approximately in the range of 1.1-1.2. In the case of rounded edges, then, the nano-crystalline core may be substantially, but not perfectly, spherical. However, the nano-crystalline core may instead be faceted. In an embodiment, the anisotropic nano-crystalline core is disposed in an asymmetric orientation with respect to the nano-crystalline shell, as described in greater detail in the example below.

Another consideration for maximization of PLQY in a quantum dot structure is to provide an asymmetric orientation of the core within a surrounding shell. For example, referring again to FIG. 5, the center 503 of the core 502 may be misaligned with (e.g., have a different spatial point than) the center 505 of the shell 504. In an embodiment, a semiconductor structure includes an anisotropic nano-crystalline core composed of a first semiconductor material. The semiconductor structure also includes a nano-crystalline shell composed of a second, different, semiconductor material at least partially surrounding the anisotropic nano-crystalline core. The anisotropic nano-crystalline core is disposed in an asymmetric orientation with respect to the nano-crystalline shell. In one such embodiment, the nano-crystalline shell has a long axis (e.g., $a_{SHELL}$), and the anisotropic nano-crystalline core is disposed off-center along the long axis. In another such embodiment, the nano-crystalline shell has a short axis (e.g., $b_{SHELL}$), and the anisotropic nano-crystalline core is disposed off-center along the short axis. In yet another embodiment, however, the nano-crystalline shell has a long axis $a_{SHELL}$) and a short axis (e.g., $b_{SHELL}$), and the anisotropic nano-crystalline core is disposed off-center at ng both the long and short axes.

With reference to the above described nano-crystalline core and nano-crystalline shell pairings, in an embodiment, the nano-crystalline shell completely surrounds the anisotropic nano-crystalline core. In an alternative embodiment, however, the nano-crystalline shell only partially surrounds the anisotropic nano-crystalline core, exposing a portion of the anisotropic nano-crystalline core, e.g., as in a tetrapod geometry or arrangement. In an embodiment, the nano-crystalline shell is an anisotropic nano-crystalline shell, such as a nano-rod, that surrounds the anisotropic nano-crystalline core at an interface between the anisotropic nano-crystalline shell and the anisotropic nano-crystalline core. The anisotropic nano-crystalline shell passivates or reduces trap states at the interface. The anisotropic nano-crystalline shell may also, or instead, deactivate trap states at the interface.

With reference again to the above described nano-crystalline core and nano-crystalline shell pairings, in an embodiment, the first and second semiconductor materials (core and shell, respectively) are each materials such as, but not limited to, Group II-VI materials, Group III-V materials, Group IV-VI materials, Group I-III-VI materials, or Group II-IV-VI materials and, in one embodiment, are mono-crystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In an embodiment, the semiconductor structure further includes a nano-crystalline outer shell at least partially surrounding the nano-crystalline shell and, in one embodiment, the nano-crystalline outer shell completely surrounds the nano-crystalline shell. The nano-crystalline outer shell is composed of a third semiconductor material different from the first and second semiconductor materials. It a particular such embodiment, the first semiconductor material is cadmium selenide (CdSe), the second semiconductor material is cadmium sulfide (CdS), and the third semiconductor material is zinc sulfide (ZnS).

With reference again to the above described nano-crystalline core and nano-crystalline shell pairings, in an embodiment, the semiconductor structure (i.e., the core/shell pairing in total) has an aspect ratio approximately in the range of 1.5-10 and, 3-6 in a particular embodiment in an embodiment, the nano-crystalline shell has a tong axis and a short axis. The long axis has a length approximately in the range of 5-40 nanometers. The short axis has a length approximately in the range of 1-5 nanometers greater than a diameter of the anisotropic nano-crystalline core parallel with the short axis of the nano-crystalline shell. In a specific such embodiment, the anisotropic nano-crystalline core has a diameter approximately in the range of 2-5 nanometers. The thickness of the nano-crystalline shell on the anisotropic nano-crystalline core along a short axis of the nano-crystalline shell is approximately in the range of 1-5 nanometers of the second semiconductor material.

With reference again to the above described nano-crystalline core and nano-crystalline shell pairings, in an embodiment, the anisotropic nano-crystalline core and the nano-crystalline shell form a quantum dot. In one such embodiment, the quantum dot has a photoluminescence quantum yield (PLQY) of at least 90%. Emission from the quantum dot may be mostly, or entirely, from the nano-crystalline core. For example, in an embodiment, emission from the anisotropic nano-crystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nano-crystalline core and nano-crystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of emission color from the semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color. These structures may also be used to downconvert or upconvert lower energy light (green, yellow, etc) from LED devices, as long as the excitation light produces emission from the structures.

The above described semiconductor structures, e.g., quantum dots, suitable for inclusion as a dispersion in a composition or composition precursor may be fabricated to further include one or more compositional transition layers between portions of the structures, e.g., between core and shell portions. Inclusion of such a transition layer may reduce or eliminate any performance inefficiency associated with otherwise abrupt junctions between the different portions of the structures. For example, the inclusion of a compositional transition layer may be used to suppress Auger recombination within a quantum dot structure. Auger recombination events translate to energy from one exciton being non-radiatively transferred to another charge carrier. Such recombination in quantum dots typically occurs on sub-nanosecond time scales such that a very short multi-exciton lifetime indicates non-radiative recombination, while higher nanosecond bi-exciton lifetimes indicate radiative recombination. A radiative bi-exciton has a lifetime approximately 2-4 times shorter than a radiative single exciton.

More specifically, as is described in greater detail below in association with FIGS. 6-8, an optimal particle (e.g., quantum dot structure) may have one or more of a high aspect ratio, a large volume relative to other quantum dot hetero-structures, and graded or alloyed transitions between different semiconductor materials. The graded or alloyed transitions can be used to render a compositional and structural transition from one component (such as a quantum dot core) to another component (such as a quantum dot shell) a smooth function rather than a step function. In one embodiment, the terms "graded," "gradient," or "grading" are used to convey gradual transitioning from one semiconductor to another. In one embodiment, the terms "alloy," "alloyed," or "alloying" are used to convey an entire volume having a fixed intermediate composition. In more specific embodiments, core or seed volume is maximized relative to shell volume for a given emission color. A graded or alloyed core/shell transition layer may be included between the two volumes.

Figure 6:
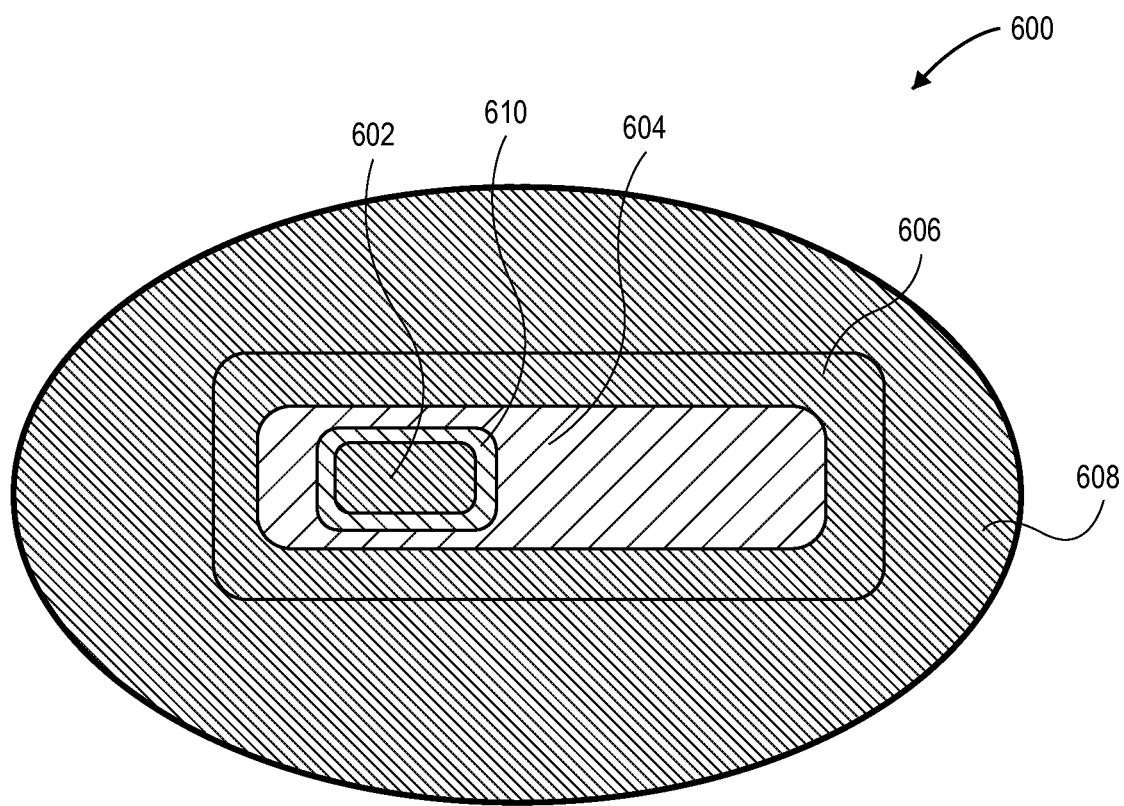
FIG. 6 illustrates a cross-sectional view of a semiconductor structure having a nano-crystalline core and nano-crystalline shell pairing with one compositional transition layer, in accordance with an embodiment of the present invention.

In a first example, FIG. 6 illustrates a cross-sectional view of a semiconductor structure having a nano-crystalline core and nano-crystalline shell pairing with one compositional transition layer, in accordance with an embodiment of the present invention.

Referring to FIG. 6, a semiconductor structure 600 includes a nano-crystalline core 602 composed of a first semiconductor material. A nano-crystalline shell 604 composed of a second, different, semiconductor material at least partially surrounds the nano-crystalline core 602. A compositional transition layer 610 is disposed between, and in contact with, the nano-crystalline core 602 and nano-crystalline shell 604. The compositional transition layer 610 has a composition intermediate to the first and second semiconductor materials.

In an embodiment, the compositional transition layer 610 is an alloyed layer composed of a mixture of the first and second semiconductor materials. In another embodiment, the compositional transition layer 610 is a graded layer composed of a compositional gradient of the first semiconductor material proximate to the nano-crystalline core 602 through to the second semiconductor material proximate to the nano-crystalline shell 604. In either case, in a specific embodiment, the compositional transition layer 610 has a thickness approximately in the range of 1.5-2 monolayers. Exemplary embodiments include a structure 600 where the first semiconductor material is cadmium selenide (CdSe), the second semiconductor material is cadmium sulfide (CdS), and the compositional transition layer 610 is composed of $CdSe_xS_y$, where $0<x<1$ and $0<y<1$, or where the first semiconductor material is cadmium selenide (CdSe), the second semiconductor material is zinc selenide (ZnSe), and the compositional transition layer 610 is composed of $Cd_xZn_ySe$, where $0<x<1$ and $0<y<1$.

In accordance with an embodiment of the present invention, the compositional transition layer 610 passivates or reduces trap states where the nano-crystalline shell 604 surrounds the nano-crystalline core 602. Exemplary embodiments of core and/or shell parameters include a struck 600 where the nano-crystalline core 602 is an anisotropic nano-crystalline core having an aspect ratio between, but not including, 1.0 and 2.0 (in a specific embodiment, approximately in the range of 1.01-1.2), and the nano-crystalline shell is an anisotropic nano-crystalline shell having an aspect ratio approximately in the range of 4-6.

In an embodiment, the nano-crystalline shell 604 completely surrounds the nano-crystalline core 602, as depicted in FIG. 6. In an alternative embodiment, however, the nano-crystalline shell 604 only partially surrounds the nano-crystalline core 602, exposing a portion of the nano-crystalline core 602. Furthermore, in either case, the nano-crystalline core 602 may be disposed in an asymmetric orientation with respect to the nano-crystalline shell 604. In one or more embodiments, semiconductor structures such as 600 are fabricated to further include a nano-crystalline outer shell 606 at least partially surrounding the nano-crystalline shell 604. The nano-crystalline outer shell 606 may be composed of a third semiconductor material different from the first and second semiconductor materials, i.e., different from the materials of the core 602 and shell 604. The nano-crystalline outer shell 606 may completely surround the nano-crystalline shell 604 or may only partially surround the nano-crystalline shell 604, exposing a portion of the nano-crystalline shell 604.

For embodiments including a nano-crystalline outer shell, an additional compositional transition layer may be included. Thus, in a second example, FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Figure 7:
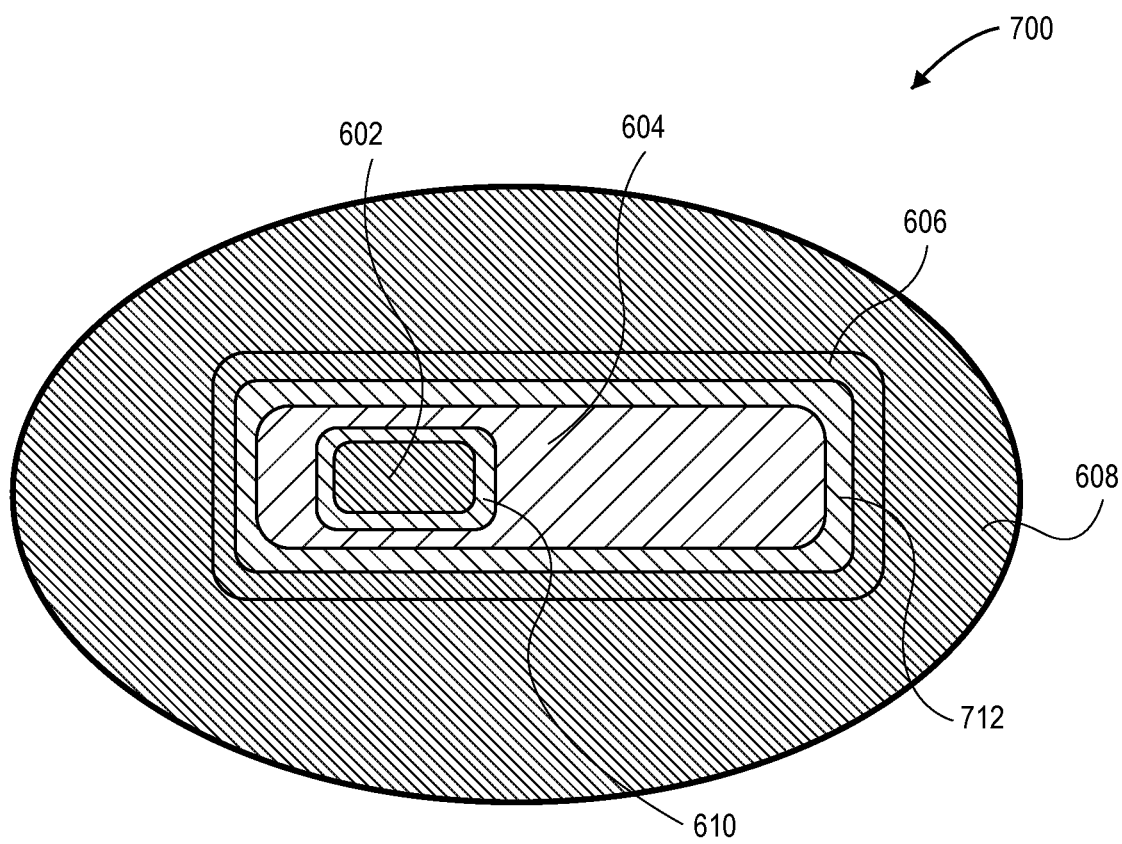
FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Referring to FIG. 7, a semiconductor structure 700 includes the nano-crystalline core 602, nano-crystalline shell 604, nano-crystalline outer shell 606 and compositional transition layer 610 of structure 600. However, in addition, semiconductor structure 700 includes a second compositional transition layer 712 disposed between, and in contact with, the nano-crystalline shell 604 and the nano-crystalline outer shell 606. The second compositional transition layer 712 has a composition intermediate to the second and third semiconductor materials, i.e., intermediate to the semiconductor materials of the shell 604 and outer shell 606.

In an embodiment, the second compositional transition layer 712 is an alloyed layer composed of a mixture of the second and third semiconductor materials. In another embodiment, the second compositional transition layer 712 is a graded layer composed of a compositional gradient of the second semiconductor material proximate to the nano-crystalline shell 604 through to the third semiconductor material proximate to the nano-crystalline outer shell 606. In either case, in a specific embodiment, the second compositional transition layer 712 has a thickness approximately in the range of 1.5-2 monolayers. Exemplary embodiments include a structure 700 where the first semiconductor material is cadmium selenide (CdSe), the second semiconductor material is cadmium sulfide (CdS), the third semiconductor material is zinc sulfide (ZnS), and the second compositional transition layer 1412 is composed of $Cd_xZn_yS$, where $0<x<1$ and $0<y<1$, or the first semiconductor material is cadmium selenide (CdSe), the second semiconductor material is zinc selenide (ZnSe), the third semiconductor material is zinc sulfide (ZnS), and the second compositional transition layer 1412 is composed of ZnSe$_x$S$_y$, where 0<x<1 and 0<y<1. In accordance with an embodiment of the present invention, the second compositional transition layer 712 passivates or reduces trap states where the nano-crystalline outer shell 606 surrounds the nano-crystalline shell 604.

For other embodiments including a nano-crystalline outer shell, an outer compositional transition layer may be included without including an inner compositional transition layer. Thus, in a third example, FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Figure 8:
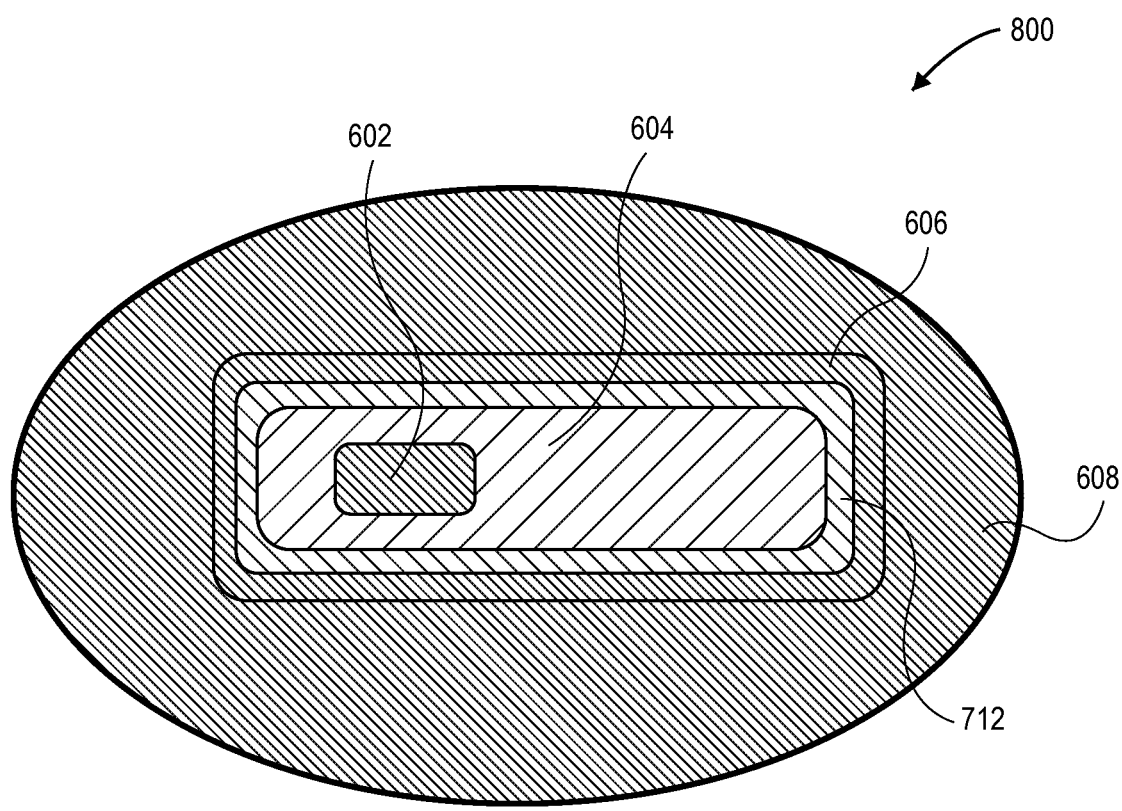
FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Referring to FIG. 8, a semiconductor structure 800 includes the nano-crystalline core 602, nano-crystalline shell 604, and nano-crystalline outer shell 606 of structure 600. In addition, the semiconductor structure 800 includes the compositional transition layer 712 of structure 700 disposed between, and in contact with, the nano-crystalline shell 604 and the nano-crystalline outer shell 606. However, structure 800 does not include the compositional transition layer 610 of structure 600, i.e., there is no compositional transition layer between the core 602 and shell 604.

Referring to FIGS. 5-8, and as depicted in FIGS. 6-8, the structures 500, 600, 700 and 800 may further include an insulator coating (e.g., shown as 608 in FIGS. 6-8) surrounding and encapsulating the nano-crystalline core/nano-crystalline shell pairing or nano-crystalline core/nano-crystalline shell/nano-crystalline outer shell combination. In one such embodiment, the insulator coating is composed of an amorphous material such as, but not limited to, silica (SiO$_x$), titanium oxide (TiO$_x$), zirconium oxide (ZrO$_x$), alumina (AlO$_x$), or hafnia (HfO$_x$). In an embodiment, insulator-coated structures based on structures 500, 600, 700 and 800 are quantum dot structures. For example, structures 500, 600, 700 and 800 may be used as a down-converting quantum dot or an up-shifting quantum dot.

Figure 9:
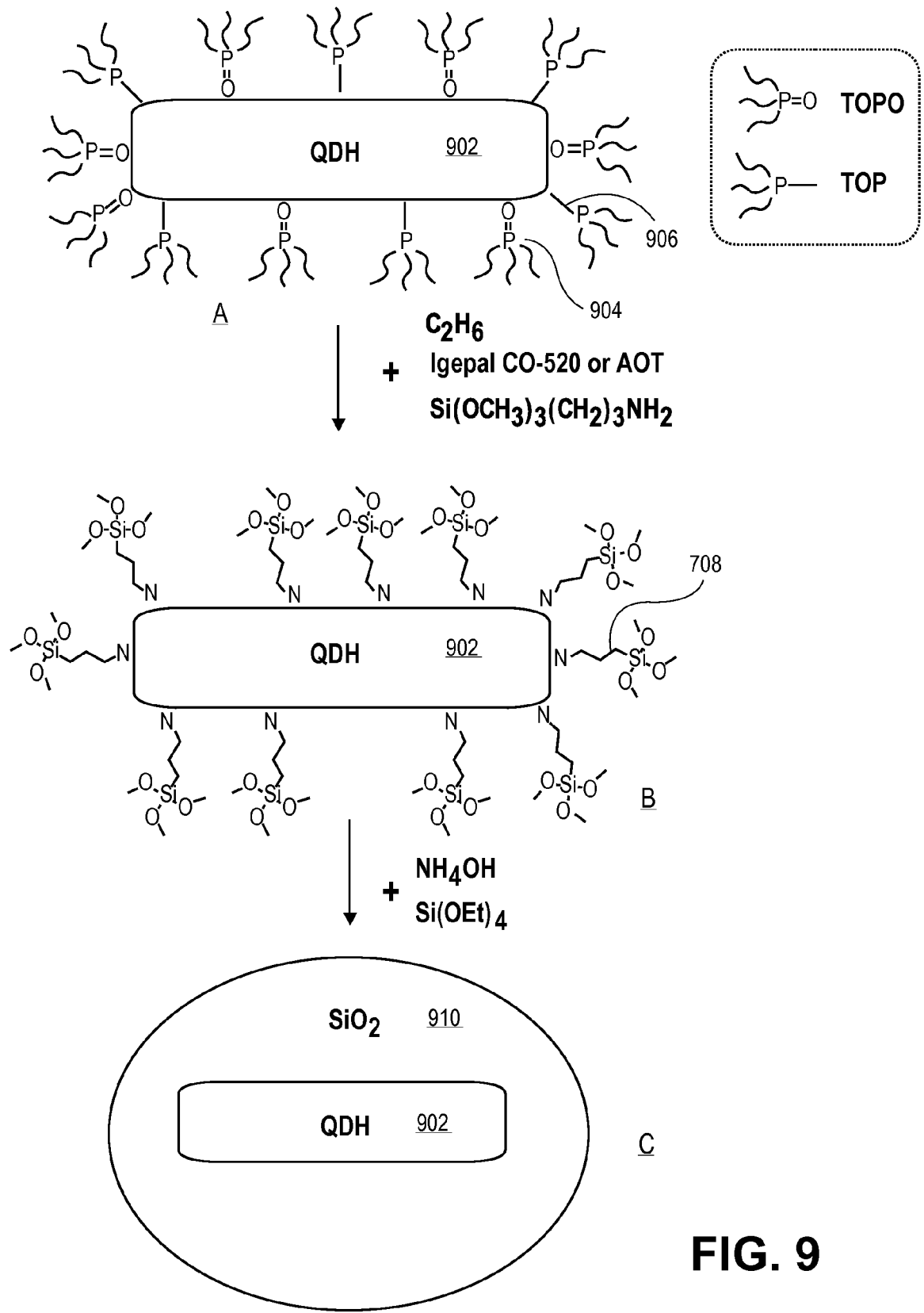
FIG. 9 illustrates operations in a reverse micelle approach to coating a semiconductor structure, in accordance with at embodiment of the present invention.

The above described insulator coating may be formed to encapsulate a quantum dot using a reverse micelle process. For example, FIG. 9 illustrates operations in a reverse micelle approach to coating a semiconductor structure, in accordance with an embodiment of the present invention. Referring to part A of FIG. 9, a quantum dot hetero-structure (QDH) 902 (e.g. a nano-crystalline core/shell pairing) has attached thereto a plurality of TOPO ligands 904 and TOP ligands 906. Referring to part B, the plurality of TOPO ligands 904 and TOP ligands 906 are exchanged with a plurality of Si(OCH$_3$)$_3$(CH$_2$)$_3$NH$_2$ ligands 908. The structure of part B is then reacted with TEOS (Si(OEt)$_4$) and ammonium hydroxide (NH$_4$OH) to form a silica coating 910 surrounding the QDH 902, as depicted in part C of FIG. 9.

In another aspect, a composition, such as composition 100 from FIG. 1, or a resulting matrix, such as matrix 106 from FIG. 1, is applied to a lighting device to provide a layer having a dispersion of semiconductor structures therein for inclusion in the lighting device. The compositions or resulting matrices can be those as described above in association with FIGS. 1-4. In one embodiment, the dispersion of semiconductor structures is a dispersion of quantum dots such as those described above in association with FIGS. 5-8.

In a first exemplary embodiment, a method of applying a light-conversion layer to a surface of a light-emitting diode (LED) includes first, separately, forming a polymer matrix or a ceramic matrix from a mixture of quantum dots and discrete prepolymer molecules or ceramic precursor molecules, respectively. The resulting polymer matrix or ceramic matrix includes a dispersion of the quantum dots therein and is then applied to the surface of the LED. In one such embodiment, applying the polymer matrix or ceramic matrix to the surface of the LED involves using a technique such as, but not limited to, spraying, dip-coating, spin-coating, or drop-casting. The polymer matrix or the ceramic matrix can be cured with ultra-violet (UV) light exposure or heating, in one embodiment.

In a second exemplary embodiment, a method of applying a light-conversion layer to a surface of a light-emitting diode (LED) includes first applying a mixture of quantum dots and discrete prepolymer molecules or ceramic precursor molecules to the surface of the LED. A polymer matrix or a ceramic matrix is then formed from the mixture of quantum dots and discrete prepolymer molecules or ceramic precursor molecules, respectively, on the surface of the LED. The resulting polymer matrix or ceramic matrix includes a dispersion of the quantum dots therein. In one such embodiment, applying the mixture of quantum dots and discrete prepolymer molecules or ceramic precursor molecules to the surface of the LED involves using a technique such as, but not limited to, spraying, dip-coating, spin-coating, or drop-casting. Forming the polymer matrix or the ceramic matrix, respectively, there from can involve curing the mixture of quantum dots and discrete prepolymer molecules or ceramic precursor molecules with ultra-violet (UV) light exposure or heating, in one embodiment. In either example, it is to be understood that the matrix or matrix precursors can be applied to discrete LED devices or, in another embodiment, prior to dicing the LED from a wafer having a plurality of LED dies. In the latter case, application of the matrix or matrix precursors may be distributed uniformly across the wafer prior to dicing the wafer.

Figure 10:
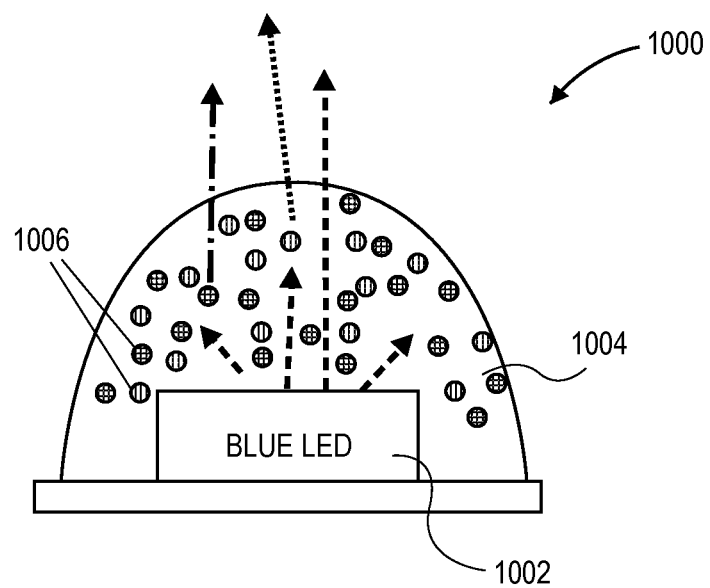
FIG. 10 illustrates a lighting device that includes a blue LED with a layer having a composition with a dispersion of quantum dots therein, in accordance with an embodiment of the present invention.

With respect to illustrating the above concepts in a resulting device configuration, FIG. 10 illustrates a lighting device 1000. Device 1000 has a blue LED 1002 with a layer 1004 having a dispersion of quantum dots 1006 therein, in accordance with an embodiment of the present invention. Devices 1000 may be used to produce "cold" or "warm" white light. In one embodiment, the device 1000 has little to no wasted energy since there is little to no emission in the IR regime. In a specific such embodiment, the use of a layer having a composition with a dispersion of anisotropic quantum dots therein enables greater than approximately 40% lm/W gains versus the use of conventional phosphors. Increased efficacy may thus be achieved, meaning increased luminous efficacy based on lumens (perceived light brightness) per watt electrical power. Accordingly, down converter efficiency and spectral overlap may be improved with the use of a dispersion of quantum dots to achieve efficiency gains in lighting and display. In an additional embodiment, a conventional phosphor is also included in the composition, along with the dispersion of quantum dots 1006.

Figure 11:
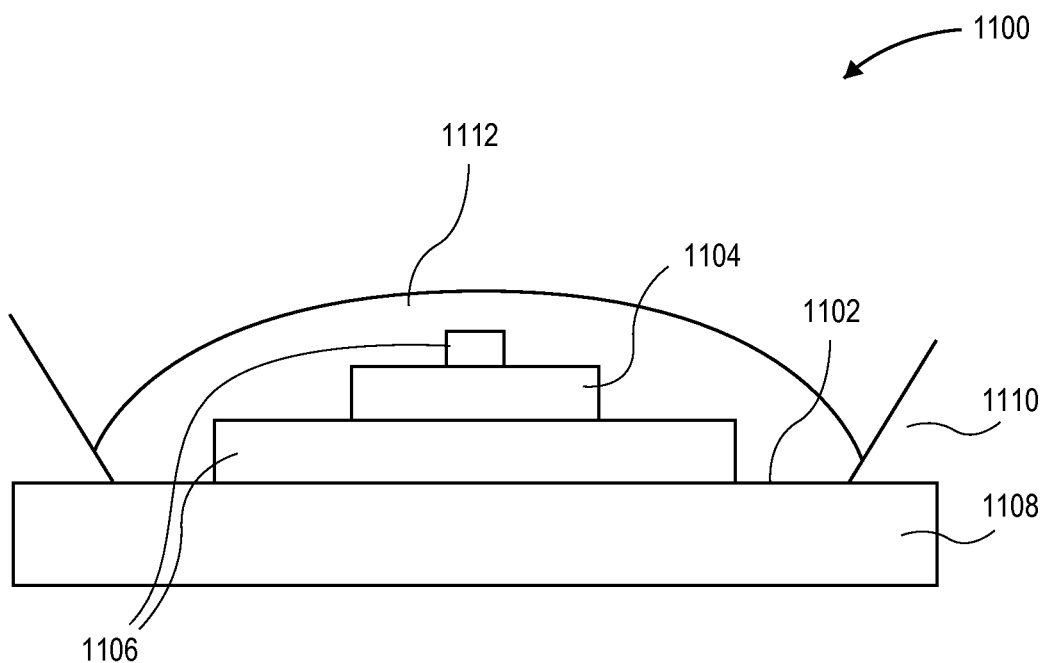
FIG. 11 illustrates a cross-sectional view of a lighting device with a layer having a composition with a dispersion of quantum dots therein, in accordance with an embodiment of the present invention.

Different approaches may be used to provide a quantum dot layer in a lighting device. In an example, FIG. 11 illustrates a cross-sectional view of a lighting device 1100 with a layer having a composition with a dispersion of quantum dots therein, in accordance with an embodiment of the present invention. Referring to FIG. 11, a blue LED structure 1102 includes a die 1104, such as an InGaN die, and electrodes 1106. The blue LED structure 1102 is disposed on a coating or supporting surface 1108 and housed within a protective and/or reflective structure 1110. A layer 1112 is formed over the blue LED structure 1102 and within the protective and/or reflective structure 1110. The layer 1112 has a composition including a dispersion of quantum dots or a combination of a dispersion of quantum dots and conventional phosphors. Although not depicted, the protective and/or reflective structure 1110 can be extended upwards, well above the matrix layer 1112, to provide a "cup" configuration.

Figure 12:
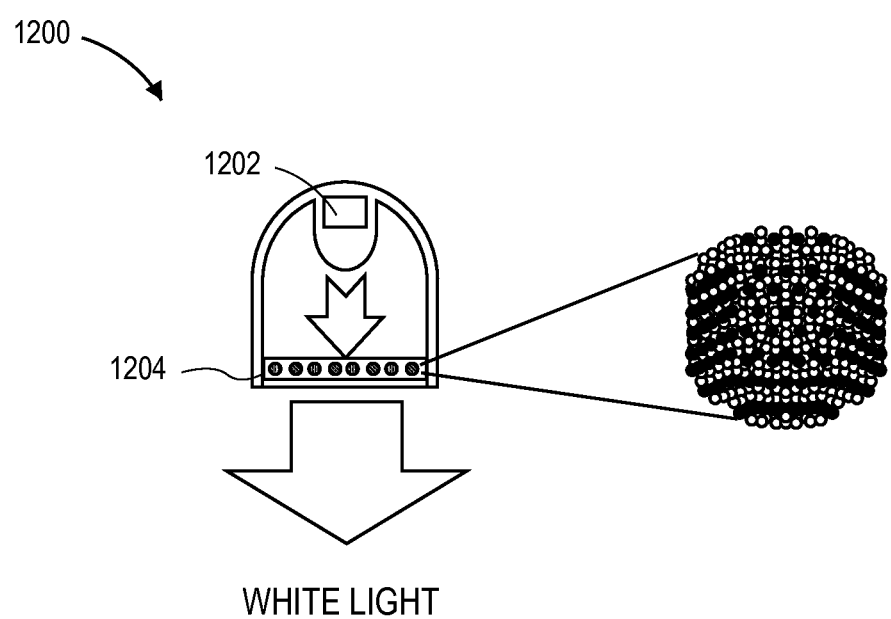
FIG. 12 illustrates a cross-sectional view of a lighting device with a layer having a composition with a dispersion of quantum dots therein, in accordance with another embodiment of the present invention.

In another example, FIG. 12 illustrates a cross-sectional view of a lighting device 1200 with a layer having a composition with a dispersion of quantum dots therein, in accordance with another embodiment of the present invention. Referring to FIG. 12, the lighting device 1200 includes a blue LED structure 1202. A quantum dot down converter screen 1204 is positioned somewhat remotely from the blue LED structure 1202. The quantum dot down converter screen 1204 includes a layer with a composition having a dispersion of quantum dots therein, e.g., of varying color, or a combination of a dispersion of quantum dots and conventional phosphors. In one embodiment, the device 1200 can be used to generate white light, as depicted in FIG. 12.

Figure 13:
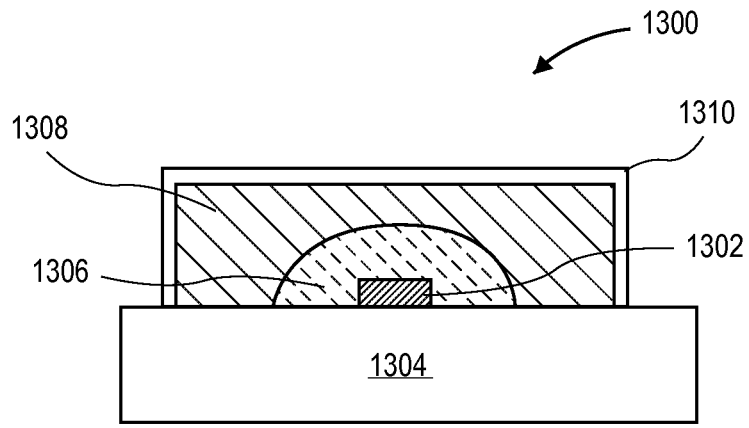
FIG. 13 illustrates a cross-sectional view of a lighting device with a layer having a composition with a dispersion of quantum dots therein, in accordance with another embodiment of the present invention.

In another example, FIG. 13 illustrates a cross-sectional view of a lighting device 1300 with a layer having a composition with a dispersion of quantum dots therein, in accordance with another embodiment of the present invention. Referring to FIG. 13, the lighting device 1300 includes a blue LED structure 1302 supported on a substrate 1304 which may house a portion of the electrical components of the blue LED structure 1302. A first conversion layer 1306 has a composition that includes a dispersion of red-light emitting anisotropic quantum dots therein. A second conversion layer 1308 has a second composition that includes a dispersion of quantum dots or green or yellow phosphors or a combination thereof (e.g., yttrium aluminum garnet, YAG phosphors) therein. Optionally, a sealing layer 1310 may be formed over the second conversion layer 1308, as depicted in FIG. 13. In one embodiment, the device 1300 can be used to generate white light.

Figure 14:
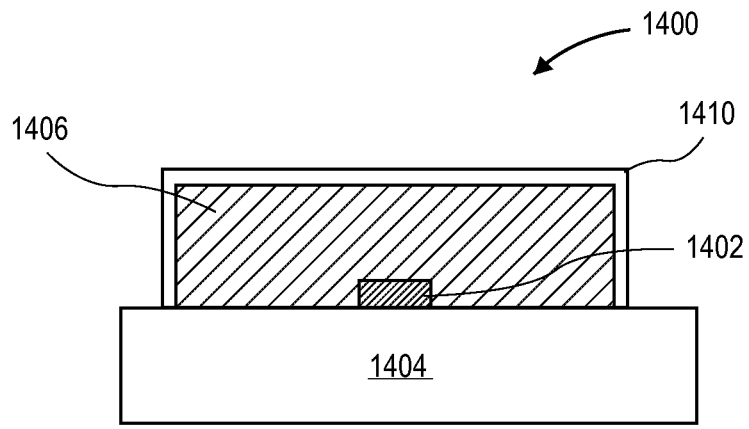
FIG. 14 illustrates a cross-sectional view of a lighting device with a layer having a composition with a dispersion of quantum dots therein, in accordance with another embodiment of the present invention.

In another example, FIG. 14 illustrates a cross-sectional view of a lighting device 1400 with a layer having a composition with a dispersion of quantum dots therein, in accordance with another embodiment of the present invention. Referring to FIG. 14, the lighting device 1400 includes a blue LED structure 1402 supported on a substrate 1404 which may house a portion of the electrical components of the blue LED structure 1402. A single conversion layer 1406 has a composition that includes a dispersion of red-light emitting anisotropic quantum dots in combination with a dispersion of green quantum dots or green and/or yellow phosphors therein. Optionally, a sealing layer 1410 may be formed over the single conversion layer 1406, as depicted in FIG. 14. In one embodiment, the device 1400 can be used to generate white light.

Figure 15A:
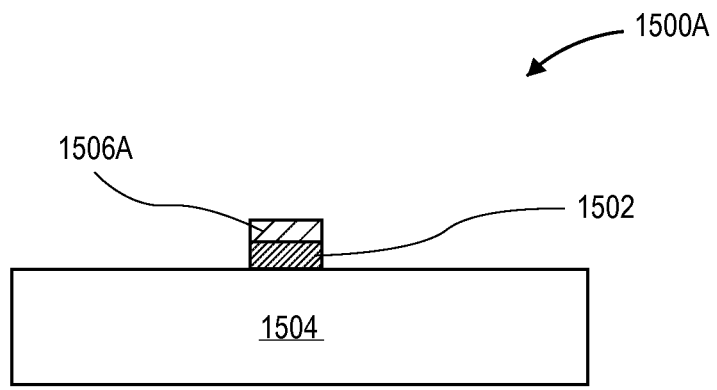
FIGS. 15A-15C illustrate cross-sectional views of various configurations for lighting devices with a layer having a composition with a dispersion of quantum dots therein, in accordance with another embodiment of the present invention.
Figure 15B:
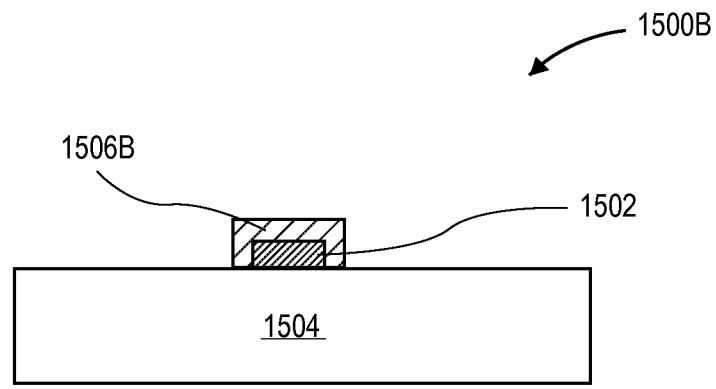
Figure 15C:
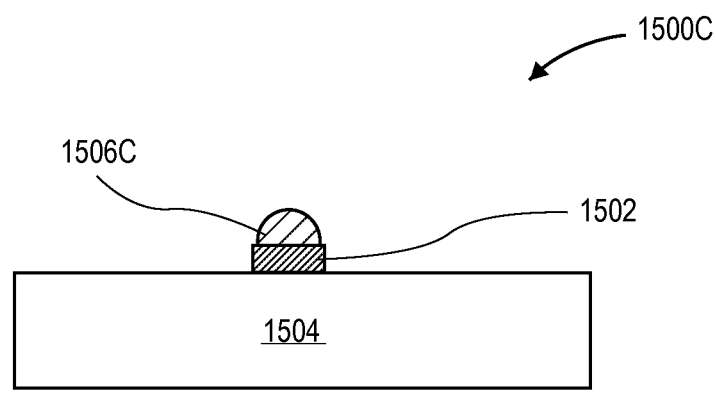

In additional examples, FIGS. 15A-15C illustrate cross-sectional views of various configurations for lighting devices 1500A-1500C with a layer having a composition with a dispersion of quantum dots therein, respectively, in accordance with another embodiment of the present invention. Referring to FIGS. 15A-15C, the lighting devices 1500A-1500C each include a blue LED structure 1502 supported on a substrate 1504 which may house a portion of the electrical components of the blue LED structure 1502. A conversion layer 1506A-1506C, respectively, has a composition that includes a dispersion of one or more light-emitting color types of quantum dots therein. Referring to FIG. 1500A specifically, the conversion layer 1506A is disposed as a thin layer only on the top surface of the blue LED structure 1502. Referring to FIG. 1500B specifically, the conversion layer 1506B is disposed as a thin layer conformal with all exposed surfaces of the blue LED structure 1502. Referring to FIG. 1500C specifically, the conversion layer 1506C is disposed as a "bulb" only on the top surface of the blue LED structure 1502. In the above examples (e.g., FIGS. 10-14 and 15A-15C), although use with a blue LED is emphasized, it is to be understood that a layer having a composition with a dispersion of quantum dots therein can be used with other light sources as well, including LEDs other than blue LEDs.

In another aspect, a composition such as composition 100 from FIG. 1 is a storable composition. As one possibility described above, the storable composition can be maintained until application to, e.g., a lighting device, is sought. The application to the lighting device can include modification of the composition to a matrix having a dispersion of semiconductor structures, e.g., quantum dots, therein, such as formation of matrix 106 of FIG. 1.

In a first example, in an embodiment, such a composition includes a medium made up of or including discrete prepolymer molecules. The medium is a liquid at 25 degrees Celsius (e.g., at room temperature). A plurality of semiconductor nano particles is suspended in the medium. In one such embodiment, the discrete prepolymer molecules are cyclic monomers. In a specific such embodiment, the cyclic monomers are cyclic siloxane monomers of the formula —[Si(R)(R')—O]—, where n is 3, 4, 5 or 6, and where R or R' is a ligand such as, but not limited to, H, Cl, an alkyl radical with 1-8 carbon atoms, a fluoroalkyl of 3-8 carbon atoms, vinyl, or combinations thereof. The medium can further include a solvent. In one embodiment, the solvent is one such as, but not limited to, toluene, ethylbenzene, tetrahydrofuran, hexane, or cyclohexane. However, in an alternative embodiment, the medium is solvent-free. As described above, in an embodiment, the semiconductor nano-particles are quantum dots.

In a second example, in another embodiment, such a composition includes a medium made up of or including ceramic precursor molecules. The medium is a liquid or gel at 25 degrees Celsius (e.g., at room temperature). A plurality of semiconductor nano-particles is suspended in the medium. In one such embodiment, the ceramic precursor molecules are discrete molecules. In another such embodiment, the ceramic precursor molecules are linear metal oxide polymers. In yet another such embodiment, the ceramic precursor molecules are thermal or ultra-violet (UV) labile polysilsequioxane molecules having one or more β-electron withdrawing groups. The medium can further include a solvent. In one embodiment, the solvent is one such as, but not limited to, toluene, ethylbenzene, tetrahydrofuran, hexane, or cyclohexane. However, in an alternative embodiment, the medium is solvent-free. As described above, in an embodiment, the semiconductor nano-particles are quantum dots.

Thus, ceramic compositions having a dispersion of nano-particles therein and methods of fabricating ceramic compositions having a dispersion of nano-particles therein have been disclosed.

What is claimed is:

1. A composition, comprising:
  a medium comprising ceramic precursor molecules, the medium a liquid or gel at 25 degrees Celsius, wherein the ceramic precursor molecules are thermal or ultra-violet (UV) labile β-chloropolysilsequioxane molecules, and wherein the medium further comprises a solvent selected from the group consisting of toluene, ethylbenzene, tetrahydrofuran, hexane, and cyclohexane; and
  a plurality of semiconductor nano-particles suspended in the medium.

2. The composition of claim 1, wherein the semiconductor nano-particles are quantum dots.

3. The composition of claim 2, wherein the quantum dots are hetero-structure quantum dots having an outer insulator coating.

4. The composition of claim 3, wherein the quantum dots each comprise an anisotropic nano-crystalline core comprising a first semiconductor material and having an aspect ratio between, but not including, 1.0 and 2.0, and a nano-crystalline shell comprising a second, different, semiconductor material at least partially surrounding the anisotropic nano-crystalline core.

5. The composition of claim 3, wherein the quantum dots each comprise a nano-crystalline core comprising a first semiconductor material, a nano-crystalline shell comprising a second, different, semiconductor material at least partially surrounding the nano-crystalline core, and a compositional transition layer disposed between, and in contact with, the nano-crystalline core and nano-crystalline shell, the compositional transition layer having a composition intermediate to the first and second semiconductor materials.

6. The composition of claim 3, wherein the quantum dots each comprise a nano-crystalline core comprising a first semiconductor material, a nano-crystalline shell comprising a second, different, semiconductor material at least partially surrounding the nano-crystalline core, a nano-crystalline outer shell at least partially surrounding the nano-crystalline shell, the nano-crystalline outer shell comprising a third semiconductor material different from the first and second semiconductor materials, and a compositional transition layer disposed between, and in contact with, the nano-crystalline shell and the nano-crystalline outer shell, the compositional transition layer having a composition intermediate to the second and third semiconductor materials.

7. The composition of claim 3, wherein the outer insulator coating comprises a layer of material selected from the group consisting of silica ($SiO_x$), titanium oxide ($TiO_x$), zirconium oxide ($ZrO_x$), alumina ($AlO_x$), and hafnia ($HfO_x$).

8. A composition, comprising:
   a medium comprising ceramic precursor molecules, the medium a liquid or gel at 25 degrees Celsius, wherein the ceramic precursor molecules are thermal or ultraviolet (UV) labile β-chloropolysilsequioxane molecules; and
   a plurality of semiconductor nano-particles suspended in the medium, wherein the semiconductor nano-particles are hetero-structure quantum dots having an outer insulator coating, wherein the hetero-structure quantum dots each comprise:
      a nano-crystalline core comprising a first semiconductor material;
      a nano-crystalline shell comprising a second, different, semiconductor material at least partially surrounding the nano-crystalline core; and
      a compositional transition layer disposed between, and in contact with, the nano-crystalline core and nano-crystalline shell, the compositional transition layer having a composition intermediate to the first and second semiconductor materials.

9. The composition of claim 8, wherein the medium is solvent-free.

10. The composition of claim 8, wherein the hetero-structure quantum dots each further comprise a nano-crystalline outer shell at least partially surrounding the nano-crystalline shell, the nano-crystalline outer shell comprising a third semiconductor material different from the first and second semiconductor materials, and a compositional transition layer disposed between, and in contact with, the nano-crystalline shell and the nano-crystalline outer shell, the compositional transition layer having a composition intermediate to the second and third semiconductor materials.

11. The composition of claim 8, wherein the outer insulator coating comprises a layer of material selected from the group consisting of silica ($SiO_x$), titanium oxide ($TiO_x$), zirconium oxide ($ZrO_x$), alumina ($AlO_x$), and hafnia ($HfO_x$).

12. The composition of claim 8, wherein the nano-crystalline core of each of the hetero-structure quantum dots has an aspect ratio between, but not including, 1.0 and 2.0.

13. A composition, comprising:
   a medium comprising ceramic precursor molecules, the medium a liquid or gel at 25 degrees Celsius, wherein the ceramic precursor molecules are thermal or ultraviolet (UV) labile β-chloropolysilsequioxane molecules; and
   a plurality of semiconductor nano-particles suspended in the medium, wherein the semiconductor nano-particles are hetero-structure quantum dots having an outer insulator coating, wherein the hetero-structure quantum dots each comprise:
      a nano-crystalline core comprising a first semiconductor material;
      a nano-crystalline shell comprising a second, different, semiconductor material at least partially surrounding the nano-crystalline core; and
      a nano-crystalline outer shell at least partially surrounding the nano-crystalline shell, the nano-crystalline outer shell comprising a third semiconductor material different from the first and second semiconductor materials, and a compositional transition layer disposed between, and in contact with, the nano-crystalline shell and the nano-crystalline outer shell, the compositional transition layer having a composition intermediate to the second and third semiconductor materials.

14. The composition of claim 13, wherein the medium is solvent-free.

15. The composition of claim 13, wherein the outer insulator coating comprises a layer of material selected from the group consisting of silica ($SiO_x$), titanium oxide ($TiO_x$), zirconium oxide ($ZrO_x$), alumina ($AlO_x$), and hafnia ($HfO_x$).

16. The composition of claim 13, wherein the nano-crystalline core of each of the hetero-structure quantum dots has an aspect ratio between, but not including, 1.0 and 2.0.

17. A composition, comprising:
   a medium comprising ceramic precursor molecules, the medium a liquid or gel at 25 degrees Celsius, wherein the ceramic precursor molecules are thermal or ultraviolet (UV) labile β-chloropolysilsequioxane molecules; and
   a plurality of semiconductor nano-particles suspended in the medium, wherein the semiconductor nano-particles are hetero-structure quantum dots having an outer insulator coating a layer of material selected from the group consisting of silica ($SiO_x$), titanium oxide ($TiO_x$), zirconium oxide ($ZrO_x$), alumina ($AlO_x$), and hafnia ($HfO_x$).

18. The composition of claim 17, wherein the hetero-structure quantum dots each comprise a nano-crystalline core having an aspect ratio between, but not including, 1.0 and 2.0.

19. The composition of claim 17, wherein the medium is solvent-free.

* * * * *